(12) United States Patent
Cox et al.

(10) Patent No.: US 10,917,124 B2
(45) Date of Patent: Feb. 9, 2021

(54) METHOD AND APPARATUS FOR ELECTROMAGNETIC FIELD MANIPULATION USING NEAR-FIELD AND FAR-FIELD SENSING

(71) Applicant: Photonic Systems, Inc., Billerica, MA (US)

(72) Inventors: Charles H. Cox, Carlisle, MA (US); Edward I. Ackerman, Needham, MA (US)

(73) Assignee: Photonic Systems, Inc., Billerica, MA (US)

( * ) Notice: Subject to any disclaimer, the term of this patent is extended or adjusted under 35 U.S.C. 154(b) by 0 days.

(21) Appl. No.: 16/207,922

(22) Filed: Dec. 3, 2018

(65) Prior Publication Data
US 2019/0115942 A1    Apr. 18, 2019

Related U.S. Application Data

(63) Continuation-in-part of application No. 15/173,146, filed on Jun. 3, 2016, now Pat. No. 10,148,007.

(60) Provisional application No. 62/171,215, filed on Jun. 4, 2015.

(51) Int. Cl.
| | |
|---|---|
| *H01Q 9/16* | (2006.01) |
| *H04B 1/04* | (2006.01) |
| *G01R 29/10* | (2006.01) |
| *H04B 10/61* | (2013.01) |
| *H04B 5/02* | (2006.01) |
| *H04B 17/10* | (2015.01) |

(52) U.S. Cl.
CPC .......... *H04B 1/0475* (2013.01); *G01R 29/10* (2013.01); *H01Q 9/16* (2013.01); *H04B 5/02* (2013.01); *H04B 10/61* (2013.01); *H04B 17/104* (2015.01); *H04B 2210/006* (2013.01)

(58) Field of Classification Search
CPC ....................................................... H01Q 1/52
See application file for complete search history.

*Primary Examiner* — Graham P Smith
(74) *Attorney, Agent, or Firm* — Rauschenbach Patent Law Group, LLC; Kurt Rauschenbach (57) ABSTRACT

An electromagnetic interface having an impedance with a resistive and a reactive component generates an electromagnetic field in both the reactive near-field region and the radiating far-field. A sensing circuit generates voltage and/or current having at least one of real and imaginary components that are proportional to an electromagnetic field in at least one of the reactive near-field region and the radiating far-field region. An electromagnetic modifier minimizes the electromagnetic field in the reactive near-field region in response to the signal generated at the output of the electromagnetic sensor.

28 Claims, 10 Drawing Sheets

METHOD AND APPARATUS FOR ELECTROMAGNETIC FIELD MANIPULATION USING NEAR-FIELD AND FAR-FIELD SENSING

CROSS REFERENCE TO RELATED APPLICATION

The present application is a continuation-in-part of U.S. patent application Ser. No. 15/173,146, entitled "Method and Apparatus for Electromagnetic Field Manipulation Using Near-Field and Far-Field Sensing", filed on Jun. 3, 2016, which claims priority to U.S. Provisional Patent Application No. 62/171,215 entitled "Method and Apparatus for Electromagnetic Field Manipulation Using Near-Field and Far-Field Sensing" filed on Jun. 4, 2015. The entire contents of U.S. patent application Ser. No. 15/173,146 and U.S. Provisional Patent Application No. 62/171,215 are herein incorporated by reference.

INTRODUCTION

A variety of electromagnetic systems require manipulation and/or optimization of the electromagnetic field around a material interface that is interacting with or that is generating the field. For example, antennas are often optimized to maximize the radiated electromagnetic energy delivered to a particular area. Waveguide devices are often optimized to capture and direct electromagnetic energy into and through the waveguide. Electromagnetic shields are often optimized to capture, and in some cases dissipate, electromagnetic energy within the material while minimizing the radiated electromagnetic energy.

In general, analysis and design of electromagnetic systems is handled differently based on the region where the electromagnetic fields are most important. The electromagnetic (EM) field on the free-space side of an interface is characterized in three main regions: 1) a reactive near-field region, 2) a radiating near-field region, and 3) a radiating far-field region. The reactive near-field region is so named because the reactive field predominates here, i.e. in this region almost none of the energy in the field radiates away from the antenna. The reactive near-field region extends from the antenna to a radius $r \leq 0.62 \cdot (D^3/\lambda)^{1/2}$, where D is the maximum linear dimension of the antenna and $\lambda$ is the wavelength of radiation. In the radiating near-field region, also called the Fresnel region, the radiating field begins to dominate, but there is still a reactive component to the field and therefore its intensity is not inversely proportional to the distance from the antenna. In the radiating far-field region, also called the Fraunhofer region or simply the far-field region, the field intensity is inversely proportional to the distance from the antenna because the radiating field dominates to the extent that almost no reactive component remains. The radiating far-field region extends to infinity beginning at a radius $r \geq 2 \cdot D^2/\lambda$ from the antenna. There are additional ways that properties of the field differ in the three different regions, but these are not relevant to the present teaching. All of the properties of electromagnetic fields are governed by a well-known set of equations known as Maxwell's Equations. This single set of equations governs the fields in all three of the regions described at the beginning of this paragraph.

Many prior art near-field systems optimize near-field radiation using near-field information. Also, many prior art far-field systems optimize far-field radiation using far-field information. However, for many real-time systems, the prior art approaches to optimization are at best not practicable, and at worst fundamentally impossible.

BRIEF DESCRIPTION OF THE DRAWINGS

The present teaching, in accordance with preferred and exemplary embodiments, together with further advantages thereof, is more particularly described in the following detailed description, taken in conjunction with the accompanying drawings. The skilled person in the art will understand that the drawings, described below, are for illustration purposes only. The drawings are not necessarily to scale, emphasis instead generally being placed upon illustrating principles of the teaching. The drawings are not intended to limit the scope of the Applicant's teaching in any way.

DESCRIPTION OF VARIOUS EMBODIMENTS

Reference in the specification to "one embodiment" or "an embodiment" means that a particular feature, structure, or characteristic described in connection with the embodiment is included in at least one embodiment of the teaching. The appearances of the phrase "in one embodiment" in various places in the specification are not necessarily all referring to the same embodiment.

It should be understood that the individual steps of the methods of the present teachings may be performed in any order and/or simultaneously as long as the teaching remains operable. Furthermore, it should be understood that the apparatus and methods of the present teachings can include any number or all of the described embodiments as long as the teaching remains operable.

The present teaching will now be described in more detail with reference to exemplary embodiments thereof as shown in the accompanying drawings. While the present teachings are described in conjunction with various embodiments and examples, it is not intended that the present teachings be limited to such embodiments. On the contrary, the present teachings encompass various alternatives, modifications and equivalents, as will be appreciated by those of skill in the art. Those of ordinary skill in the art having access to the teaching herein will recognize additional implementations, modifications, and embodiments, as well as other fields of use, which are within the scope of the present disclosure as described herein.

The present teaching relates to methods and apparatus for providing a desired far-field radiation based on feedback from known characteristics of an associated reactive near-field radiation. In addition, the present teaching relates to methods and apparatus for providing a desired reactive near-field radiation based on feedback from known characteristics of an associated far-field radiation.

Figure 1:
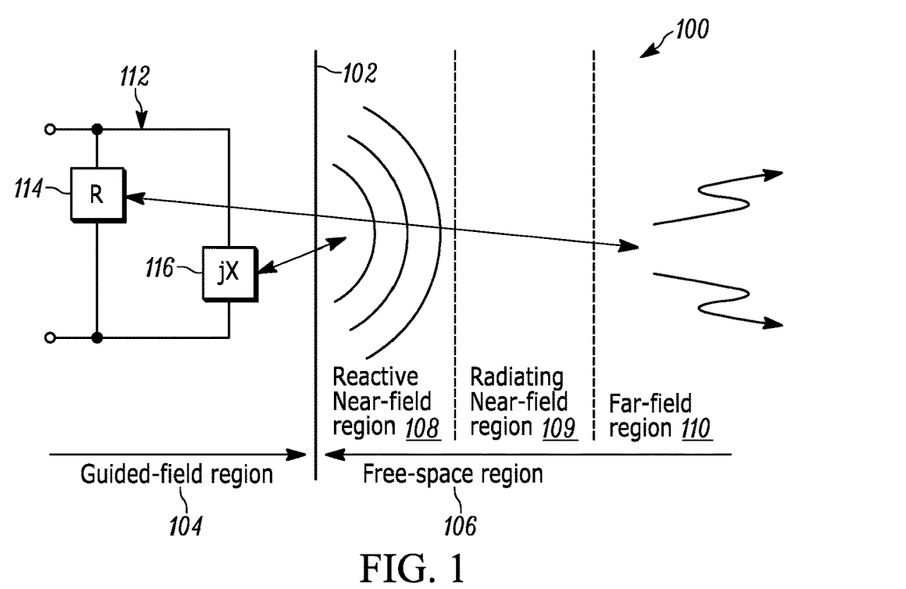
FIG. 1 illustrates an embodiment of the electromagnetic radiation surrounding an interface between a guided-field region and free-space region of an electromagnetic system of the present teaching. The solution to Maxwell's field equations indicate that the field behaves differently in three different portions of the free-space region: 1) the reactive near-field region, 2) the radiating near-field region, and 3) the far-field region.

FIG. 1 illustrates an embodiment 100 of the reactive near-field, radiating near-field, and far-field regions of an electromagnetic radiation surrounding an interface 102 between a guided-field region 104 and a free-space region 106 of an electromagnetic system of the present teaching. The electromagnetic (EM) fields on the free-space region 106 side of an interface 102 between the guided-wave region 104 and the free-space-wave region 106 are characterized into three regions, a reactive near-field region 108, a radiating near-field region 109 and a far-field region 110. In the reactive near-field region 108 the electromagnetic field is predominantly reactive and thus does not radiate away from the interface 102. In the radiating near-field region 109 a significant component of the electromagnetic field does radiate away from the interface 102, but there is still a non-negligible reactive component to the field. In the far-field region 110 the electromagnetic field radiates away from the interface 102, and the reactive component of the field is negligible.

FIG. 1 illustrates that the guided-field region 104 of the interface 102 can be represented by a complex impedance 112. The energy dissipated in the real component 114 of this complex impedance 112 corresponds to energy that is lost or dissipated at the interface 102. Assuming that the loss resistance of the antenna is negligible, i.e. that the resistance of the wires and metal from which the antenna is fabricated is negligible, the energy dissipated in the real component 114 of the impedance corresponds to the portion of the electromagnetic field on the free-space region 106 side of the interface 102 that radiates away from the interface. Most of the energy dissipated in the real component 114 of the complex impedance 112 corresponds to radiation of the field that occurs in the far-field region 110, although some of the energy dissipated corresponds to radiation of the field that occurs in the radiating near-field region 109. The energy in the reactive component 116 of the impedance 112 represents stored energy. Thus, the reactive component 116 corresponds to the energy that is stored mostly in the reactive near-field region 108 on the free-space region 106 side of the interface 102, and to a lesser but non-negligible extent in the radiating near-field region 109.

Engineered electromagnetic systems frequently need to modify either the electromagnetic field in either the reactive near-field or the far-field region to manipulate or to optimize performance. One common example of such an electromagnetic system is a transmitter that includes an antenna. In transmitters, the interface is an antenna and the radiated electromagnetic field in the far-field region is often maximized to improve the antenna's transmission capability. In some transmitters, it is desirable to minimize the reactive near-field electromagnetic radiation to thereby minimize the mutual electromagnetic coupling between the antenna and nearby structures to reduce interference and also to improve antenna performance.

The location of the boundary between the reactive near-field region and the radiating near-field region of an antenna, and the location of the boundary between the radiating near-field region and the far-field region of an antenna both depend upon the geometry and other physical properties of the antenna. For the sake of clarity, but without loss of generality, the locations of these boundaries are derived here in the specific case where the antenna is a halfwave dipole antenna—i.e., a dipole antenna operated at a frequency whose length is half of the free-space wavelength corresponding to that frequency. For a half-wave dipole positioned with its longest dimension along the z-axis of a cylindrical coordinate system and with its center at z=0, the general equations for the fields in the z=0 plane are as follows:

$$E_{z,halfwave}(z=0) = -j\frac{\eta I_0}{2\pi} \frac{e^{-j\frac{2\pi}{\lambda}\sqrt{\rho^2+\left(\frac{\lambda}{4}\right)^2}}}{\sqrt{\rho^2+\left(\frac{\lambda}{4}\right)^2}}$$

$$H_{\varphi,halfwave}(z=0) = j\frac{I_0}{2\pi\rho} e^{-j\frac{2\pi}{\lambda}\sqrt{\rho^2+\left(\frac{\lambda}{4}\right)^2}}$$

where $I_0$ is the current at the antenna port, $\eta$ is the impedance of free space, and $\lambda$ is the wavelength of the radiation in free space. All other field components ($E_\rho$, $E_\varphi$, $H_\rho$, and $H_z$) are equal to 0 in the z=0 plane. The boundaries between the regions are defined by observing the dependence of the energy flux density on the distance from the antenna ($\rho$). The energy flux density radiating from the halfwave dipole in the z=0 plane is calculated using the Poynting vector:

$$\vec{S} = \vec{E} \times \vec{H} = \frac{\eta I_0^2 e^{-j\frac{2\pi}{\lambda}\sqrt{\rho^2+\left(\frac{\lambda}{4}\right)^2}}}{4\pi^2 \rho \sqrt{\rho^2+\left(\frac{\lambda}{4}\right)^2}} \vec{a}_\rho.$$

The reactive near-field region is the region in which the energy flux density's dependence on distance $\rho$ from the antenna is dramatically different from the well-known $\rho^{-2}$ dependence of the field in free space. For the halfwave dipole whose governing equations are given above, this reactive near-field region is defined for distances from the antenna between 0 and 0.22$\lambda$, because at these distances the energy flux density has an approximately $\rho^{-1}$ dependence, and therefore much of the energy is being stored in this region rather than radiating away as it does in free space where the dependence on distance is proportional to $\rho^{-2}$. At the other extreme, i.e. beyond the inner boundary of the far-field region, the energy flux density does have the well-known $\rho^{-2}$ dependence on distance. This inner boundary of the far-field region occurs at a distance of 0.5$\lambda$ for the halfwave dipole. Between the outer boundary of the reactive near-field region and the inner boundary of the far-field region—i.e. for 0.22$\lambda$<$\rho$<0.5$\lambda$—the energy flux density's dependence on distance from the antenna is transitioning between the $\rho^{-1}$ dependence of the reactive near-field region and the $\rho^{-2}$ dependence of the far-field region. This region is called the radiating near-field region—i.e., it is called a near-field region because the radiated energy does not yet have the well-known $\rho^{-2}$ dependence with distance as it does in the far-field region, but it is called a radiating region because the energy is not being stored as effectively as in the reactive near-field region.

Another way in which the behavior of the field varies from one region to the next is the rate at which the phase of the field depends on distance from the antenna. In the reactive near-field region, which in the case of the halfwave dipole has a radius of 0.22$\lambda$ extending outward from the antenna, the phase of the field in the z=0 plane only changes by 30° rather than the 79° phase change that a plane wave in free space would incur over the same distance. In the radiating near-field region, the phase change between its inner boundary of 0.22$\lambda$ and its outer boundary of 0.5$\lambda$ is 81°, which is still less than the 101° phase change that a plane wave in free space would incur in this distance but not as drastic a difference as occurs in the reactive near-field region. Beyond the far-field boundary, the field's phase does change with distance at the expected rate of 360° per wavelength. Prior art electromagnetic systems rely on a variety of methods to modify the electromagnetic fields in the reactive near-field region and/or the radiating near-field region and/or the far-field region, depending on the particular application. In electromagnetic wave guided systems, impedance matching has been used to improve the radiated energy. In free-space electromagnetic systems, resonant and other structures have been used to reduce the mutual coupling. A common limitation in all these prior art systems is that while they are designed ideally to affect either the energy in the real component of the impedance that corresponds predominantly to the field in the far-field region (and, to a lesser degree, to the field in the radiating near-field region) or the energy in the reactive component of the impedance that corresponds predominantly to the field in the reactive near-field region (and again, to a lesser degree, to the field in the radiating near-field region), in practice both the fields in all three regions are affected. For example, techniques that are designed to reduce the energy stored in the reactive near field also alter the electromagnetic radiation in the far field, which is highly undesirable. Similarly, techniques that are designed to reduce the energy unintentionally coupled to nearby structures as the desired outcome, also alter the electromagnetic radiation in the antenna's far-field region, which is also highly undesirable.

One aspect of the present teaching is that it views the electromagnetic field in the free-space region on one side of an interface from the guided-wave side, correlating the Maxwell equation solutions with energies in the resistive and reactive portions of the impedance.

A second aspect of the present teaching is that it provides a means for predominantly sensing the electromagnetic radiation in the far-field or the reactive near-field region while having a significant effect on the portion of the field in the other region. That is, apparatus according to the present teaching that affects the energy in the real component of the impedance predominantly affects the portion of the electromagnetic radiation in the far-field region, but essentially does not affect, or minimally affects, the energy in the reactive component of the impedance that predominantly affects the electromagnetic radiation in the reactive near-field region. As such, a technique that is designed to reduce the energy stored in the electromagnetic radiation in the reactive near-field region as the desired outcome will only minimally affect the electromagnetic radiation in the far-field region. Similarly, a technique that is designed to reduce the energy unintentionally coupled to nearby structures as the desired outcome of the present teaching will only minimally affect the electromagnetic radiation in the far-field region.

A third aspect of the present teaching is that it avoids a problem associated with the prior art approach of sensing in the electromagnetic field in one region, such as the far-field region, and then trying to optimize the electromagnetic field in the same region of the electromagnetic field. The problem with this prior art approach is that the parameter being modifying is the same parameter that is being sensed. Such a method has inherent limitations because, in the limit when one electromagnetic field component is completely suppressed, which is often the objective, there is no electromagnetic field component to sense and hence no signal to drive or feed back to the modification process.

For a given guided electromagnetic field region 104 and free-space region 106, there is a particular ratio between the current in the real impedance 114 corresponding predominantly to the field in the far-field region 110, and the current in the imaginary impedance 116 corresponding predominantly to the field in the reactive near-field region 108. This ratio is determined for a particular interface 102 by many factors. One important factor is the geometry and the material composition of the interface. The ratio could be represented from the guided-side of the interface, for example, by a particular combination of real 114 and imaginary 116 components of the complex impedance 112.

For ease of explanation, but without loss of generality, in FIG. 1 we have represented the real part of the complex impedance by a single component 114 and the imaginary part of the complex impedance by a single component 116. In actual practice the real and/or imaginary parts may each be represented by multiple components. Further, the circuit connection of these multiple components may be more intricate than the simple parallel connection shown in FIG. 1.

In many embodiments of the apparatus of the present teaching, the electromagnetic field optimization apparatus of the present teaching predominantly modifies the field of a given interface in only one of the free-space regions. This is accomplished by augmenting the interface with two additional capabilities. The first additional capability is to preferentially sense the field in one of the regions, either the reactive near-field region or the far-field region. The second additional capability is to preferentially modify the field in the other region, i.e. the region in which the field is not preferentially sensed.

In one particular application according to the present teaching, the mutual coupling between an antenna and its surroundings is minimized. This is accomplished by sensing a portion of the radiated field in the far-field region. The resulting signal is used to preferentially modify the conditions at the interface such that the ratio of fields in the reactive near-field and the far-field regions is minimized.

Figure 2:
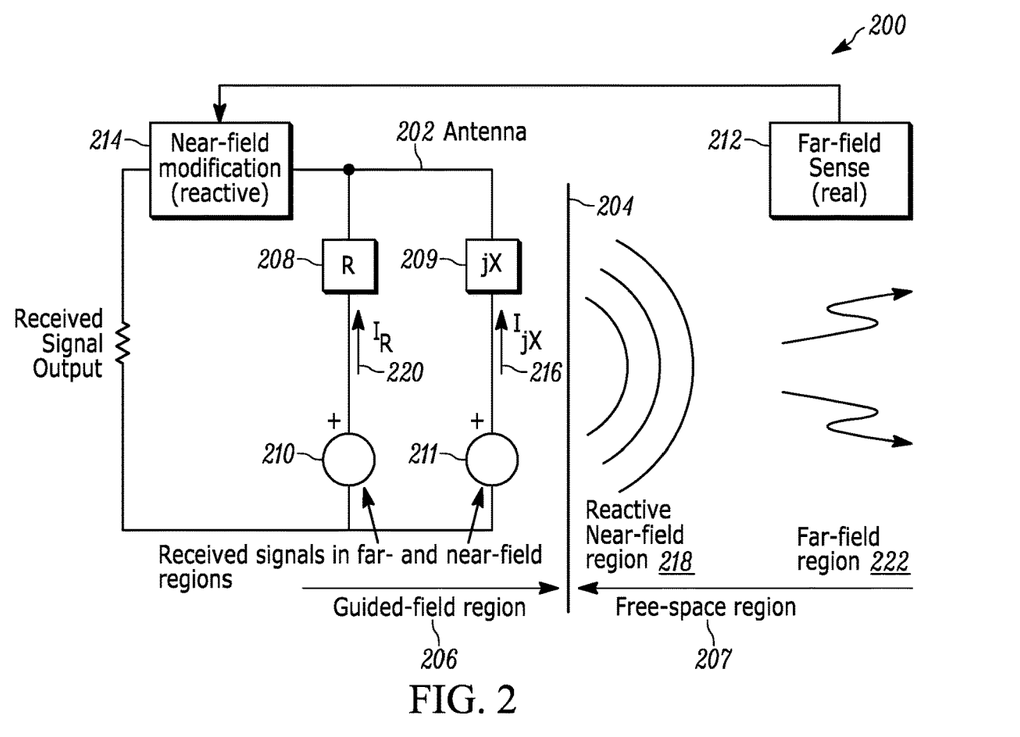
FIG. 2 illustrates an embodiment of the electromagnetic field optimization apparatus of the present teaching that modifies near-field mutual coupling of an antenna using far-field sensing.

One feature of the present teaching is the ability to reduce the mutual coupling around an antenna interface by minimizing the field in the reactive near-field region. FIG. 2 illustrates an embodiment of the electromagnetic field optimization apparatus 200 of present teaching that modifies mutual coupling of the field in an antenna's reactive near-field region using sensing of the field in its far-field region. One way to implement sensing the electromagnetic field in the far-field region is to physically locate an electromagnetic sensor in the far-field region. Since this approach may be difficult to implement in some configurations, we can equivalently sense the electromagnetic field in the far-field region on the guided-wave side of the interface by sensing the real component of the antenna current. The apparatus 200 of FIG. 2 is described in connection with the guided-to-free-space interface 204 being an antenna. However, it is understood that the guided-to-free-space interface 204 can be numerous other types of interfaces.

In one embodiment, both the sensing and the modification functions can be implemented on the guided-field region 206 side of the interface 204. However, one skilled in the art will appreciate that in other embodiments, the sensing and the modification functions can be performed on the free-space region 207 side of the interface 204, since there is a correspondence between the circuit parameters on the guided-field region 206 side of the interface 204 and the field parameters on the free-space region 207 side of the interface 204. This correspondence is a key aspect of the present teaching.

The guided-wave region 206 of the antenna can be represented by its equivalent circuit impedance 202, which can, for example, be represented as a Thevenin or a Norton equivalent circuit. In FIG. 2, the equivalent circuit impedance 202 includes a resistive component 208 that predominantly represents the field in the antenna's free-space far-field region and a reactive component 209 that predominantly represents the field in the antenna's reactive near-field region. In FIG. 2, a received signal, as detected on the free-space side of the interface by the antenna, can be represented on the guided-wave, or circuit, side of the interface, which is shown in FIG. 2, as a signal generator 210 that is in series with the resistive component 208 if it is received from the far-field region, and as a signal generator 211 in series with the reactive component 209 if it is received from the reactive near-field region.

The antenna represented as the equivalent circuit impedance 202 coupled to the signal generators 210 and 211 is electrically connected to a near-field modification means 214. The far-field electromagnetic sensor 212 senses the antenna's free-space electromagnetic radiation in the far-field region. This is a radiating far-field sensor. In one embodiment, the far-field electromagnetic sensor 212 includes an electro-optic modulator comprising un-terminated electrodes and the electromagnetic modifier comprises a voltage source. Equivalently, on the guided-wave side of the interface, the sensed far-field is represented by the voltage across the resistive component 208 being in phase with the current 220 through it.

The near-field modification means 214 utilizes a component in which the magnitude of the voltage or current is modified while keeping the voltage 90° out of phase with the current through the component. In one embodiment, a varactor, which is a voltage-controlled capacitor, can be the near-field modification means 214.

The near-field modification means 214 results in a voltage at the antenna port that affects the current $I_{jX}$ 216 flowing in the reactive portion of the antenna impedance 209. If, for example, the desired modification is to minimize the field in the reactive near-field region 218, then the near-field modification means must set the voltage at the antenna port equivalent circuit impedance 202 equal to the voltage corresponding to the field in the reactive near-field region 218, which is a portion of the voltage source 211 shown in FIG. 2. When the voltage at the antenna port equivalent circuit impedance 202 is exactly equal to this voltage, $I_{jX}$ 216 will equal zero, but $I_R$ 220 will not equal zero because there will still be a difference between the voltage at the antenna port equivalent circuit impedance 202 and the voltage 210 corresponding to the field in the far-field region of the antenna 222. Therefore, the application of a voltage at the antenna port equivalent circuit impedance 202 by the near-field modification means 214 results in a field at the far-field electromagnetic sensor 212 that is non-zero, and thus it is possible for the near-field modification means 214 to continue maintaining the correct voltage at the antenna port equivalent circuit impedance 202 to minimize the field in the reactive near-field region 218 without requiring infinite gain between the far-field electromagnetic sensor 212 and the near-field modification component 214 as the field in the reactive near-field region approaches zero.

Figure 3:
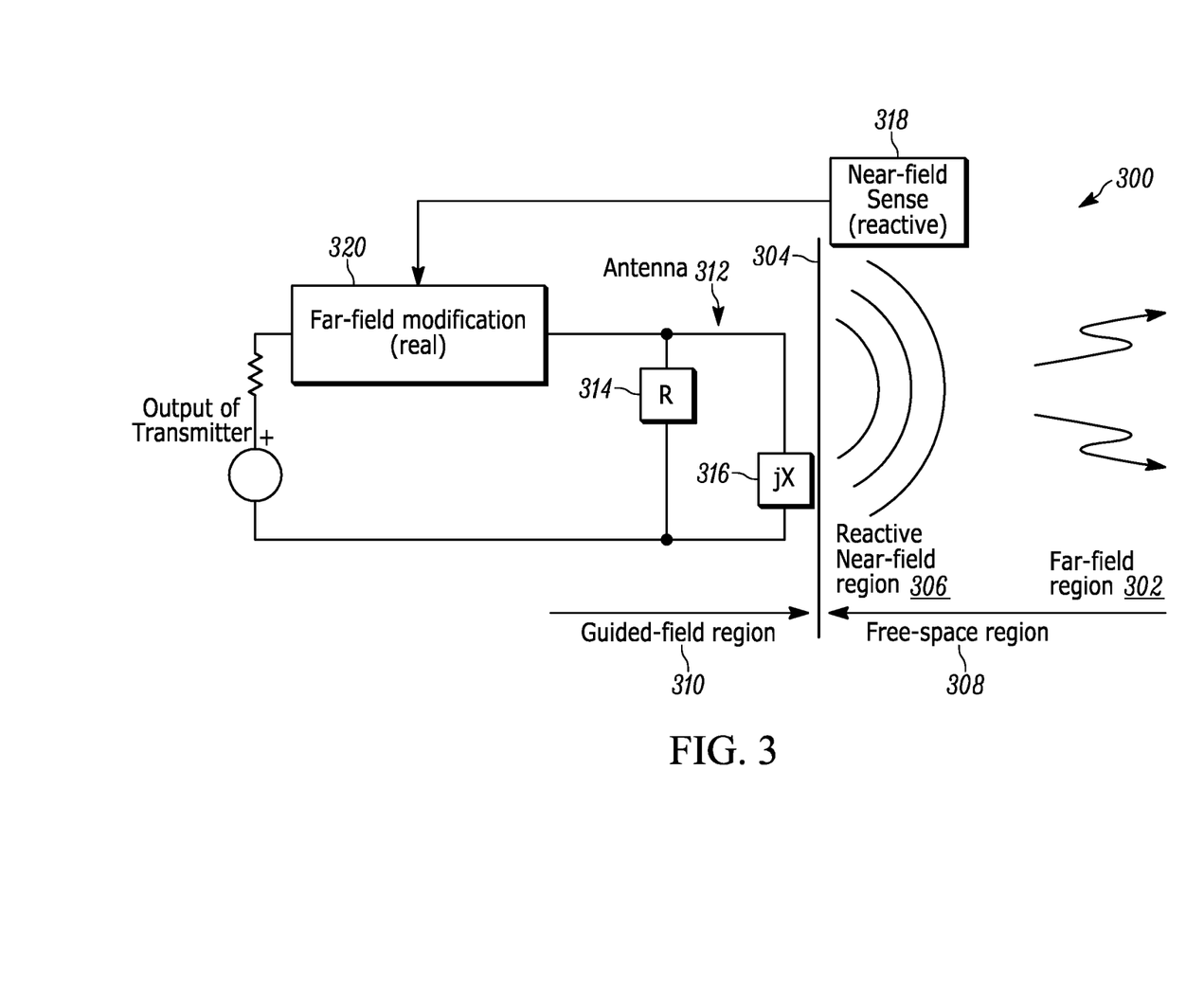
FIG. 3 illustrates an embodiment of the electromagnetic field optimization apparatus of the present teaching that modifies radiation of an antenna in its far-field region using near-field sensing.

One feature of the present teaching is the ability to improve the efficiency of an antenna by maximizing the radiated field in the far-field region. FIG. 3 illustrates an embodiment of the electromagnetic field optimization apparatus 300 of the present teaching that modifies the radiation in the far-field region 302 of a guided-to-free-space interface 304 by sensing the field in the reactive near-field region 306. In this embodiment, the guided-to-free-space interface 304 is an antenna that is being used to transmit a signal. The sensing function is implemented on the free-space region 308 side of the interface 304, and the modification function is implemented on the guided-field region 310 side of the interface 304.

The guided-wave region 310 side of the interface 304 is represented by its equivalent circuit impedance 312, which can, for example, be represented as a Thevenin or a Norton equivalent circuit. In FIG. 3, the equivalent circuit impedance 312 comprises a resistive component 314 and a reactive component 316 that represent the antenna's free-space radiation in the far-field region 302 and in the reactive near-field region 306, respectively. An electromagnetic sensor 318 that senses only the reactive component of the free-space region 308 in the reactive near-field region 306 is used to sense the antenna's field in the free-space reactive near-field region. In one embodiment, the electromagnetic sensor 318 is a sensor whose voltage is 90° out of phase with the current through it. For example, the sensor 318 can be an electrically short dipole antenna—i.e., a dipole antenna operated at a frequency corresponding to a wavelength at least a factor of 20 longer than the dipole.

On the guided-field region 310 side of the interface 304, a far-field modification component 320, which is an electromagnetic modifier that is capable of modifying the radiation in the far-field region 302 is used. Specifically, a component in which the magnitude of the voltage or current is modified while keeping the voltage in phase with the current through it can be used.

Figure 4A:
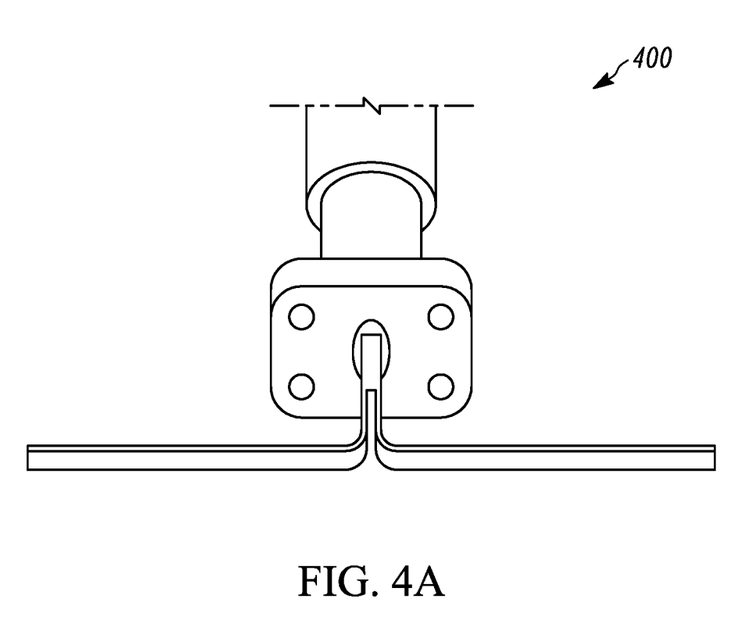
FIG. 4A illustrates an embodiment of a dipole antenna of the present teaching that is electrically short when operated at a frequency for which the free-space wavelength is a factor of 20 greater than the dipole length.

To demonstrate that an electrically short dipole antenna of the present teaching can indeed function as a free-space, near-field electromagnetic sensor, measurements of such a sensor were made in an anechoic chamber. FIG. 4A illustrates an embodiment of an electrically short dipole antenna 400 of the present teaching. This dipole antenna was designed and constructed to act as a sensor of 300 MHz radiation in the reactive near-field region of a larger dipole antenna.

Figure 4B:
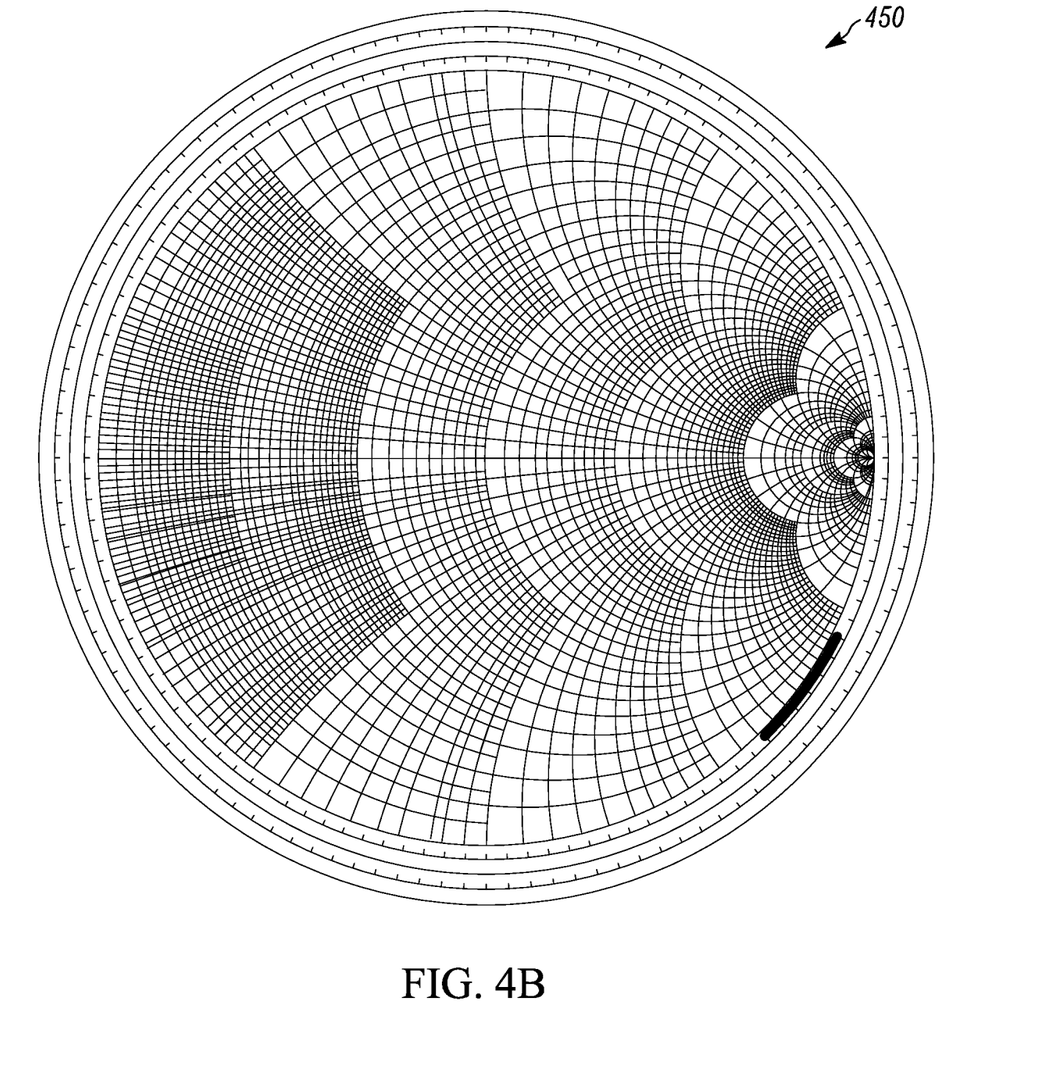
FIG. 4B illustrates a Smith Chart plot of the measured impedance of the electrically short dipole antenna measured using one port of a programmable network analyzer.

To confirm that the electrically short dipole's impedance is capacitive, its impedance was measured and plotted on a Smith chart. FIG. 4B illustrates a Smith Chart plot 450 of the impedance of the electrically short dipole antenna shown in FIG. 4A. The data of FIG. 4B confirm that the electrically short dipole's impedance is predominately capacitive. Thus, the electrically short dipole 400 can be used as a near-field electromagnetic sensor.

Figure 5:
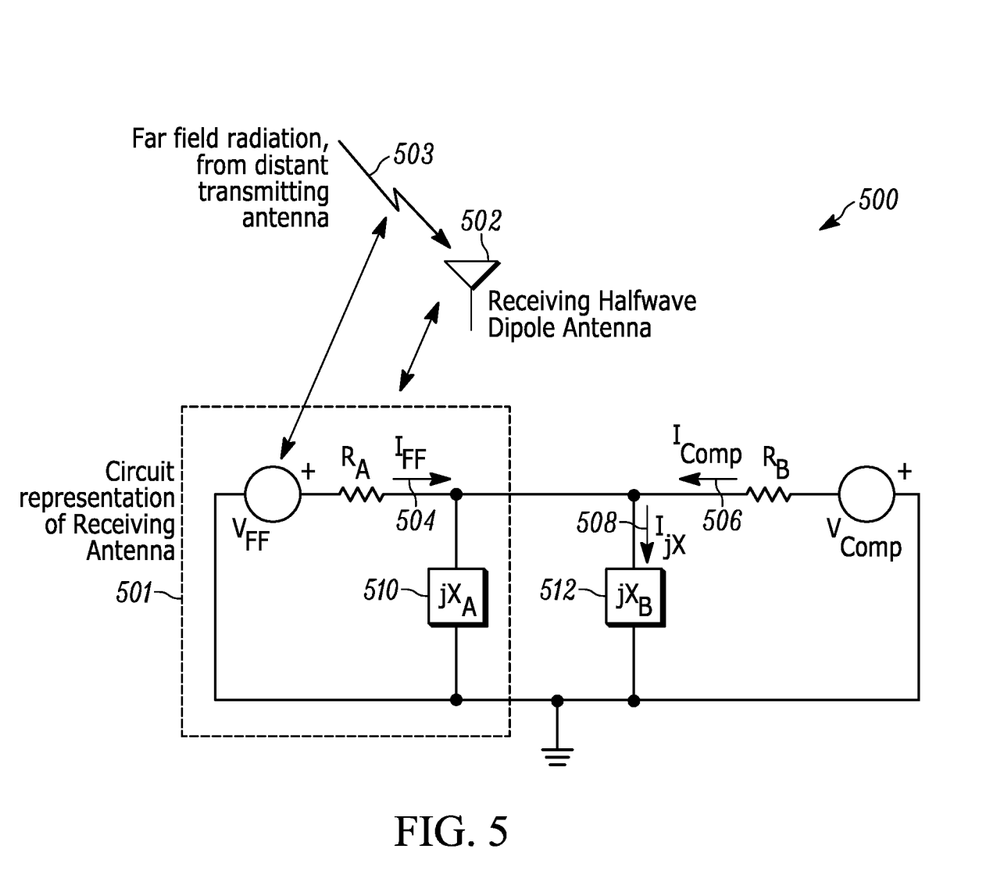
FIG. 5 illustrates an embodiment of a circuit of the present teaching consisting of a voltage $V_{FF}$, a resistance $R_A$, and a reactance $jX_A$ that together simulate an antenna receiving a signal from a distant transmitting antenna, and a compensation circuit in which a voltage source $V_{Comp}$ is adjusted until the ratio of currents $I_{Comp}/I_{jX}$ through two circuit elements $R_B$ and $jX_B$ corresponds to the desired value of $I_F$ and therefore to the desired modification of the field in the far-field region.

FIG. 5 shows an example embodiment 500 of an equivalent circuit 501 for a half-wave dipole antenna 502, in which the current $I_{FF}$ 504 corresponds to the radiated field in the antenna's far-field region 503. It has been demonstrated that this radiated field in the antenna's far-field region can be affected to a greater degree than reactive field in the antenna's reactive near-field region. Although an antenna does not permit access to the two terminals between which $I_{FF}$ flows, in this circuit $I_{FF}$ approaches 0 as the ratio of the two measurable current levels $I_{Comp}$ 506 and $Ij_x$ 508 approaches the ratio of the sum of two reactances $jX_A+jX_B$ to just the single reactance $jX_B$ 512. As $I_{FF}$ is made to approach 0, the current through the antenna's reactance $jX_A$ 510—which corresponds to the field in the reactive near-field region—does not approach 0.

Figure 6A:
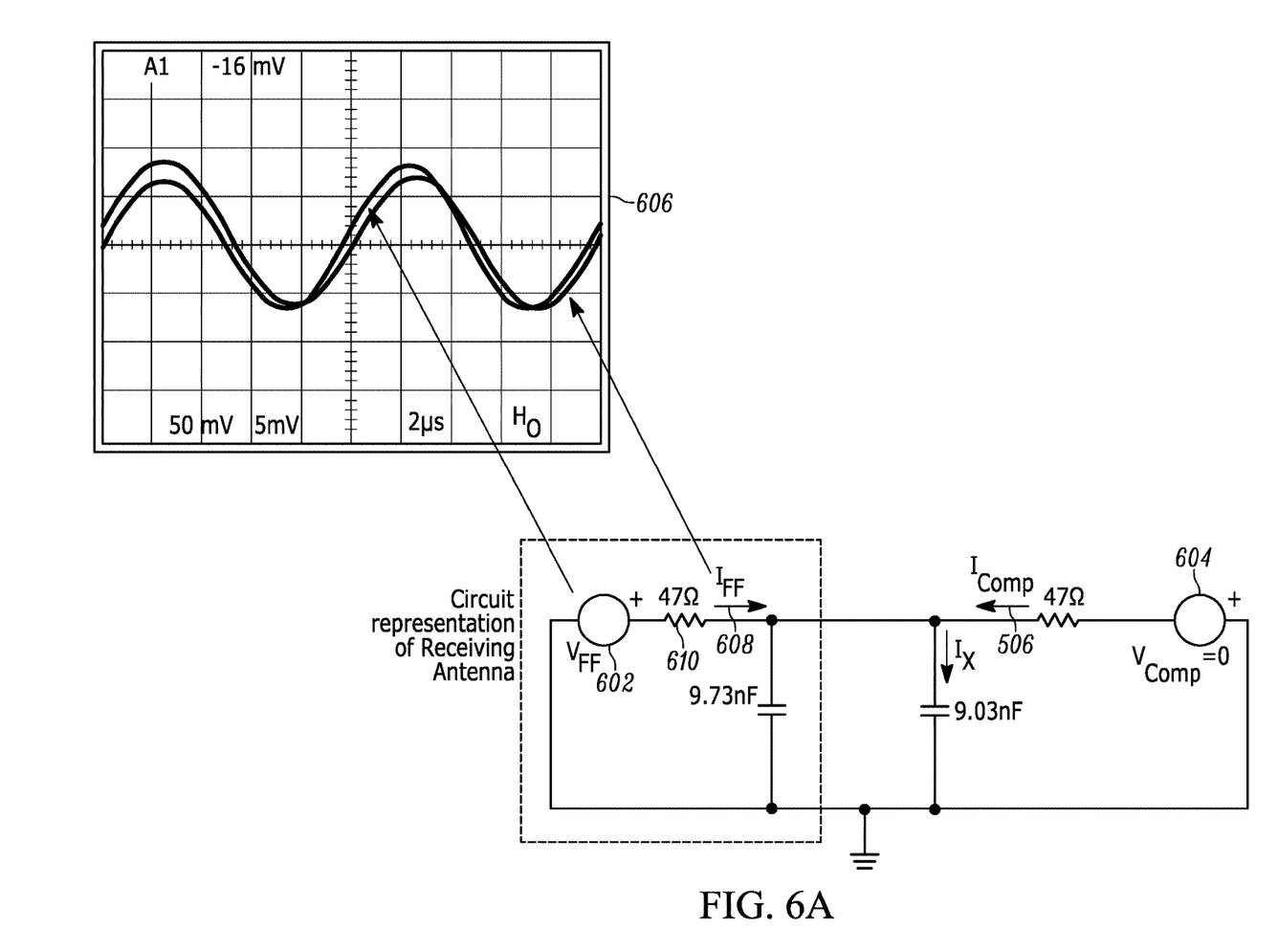
FIG. 6A illustrates an embodiment of the circuit in FIG. 5 of the present teaching that includes specific values of the resistances, reactances and voltage sources. An oscilloscope trace shows the measured signal applied by the voltage source $V_{FF}$ and the resulting signal $I_{FF}$ when $V_{Comp}$ is equal to zero—i.e., when the energy dissipated in the circuit element corresponding to the field in the far-field region of the antenna is not being modified.

To demonstrate this, the circuit shown in FIG. 5 was assembled using lumped elements with the measured values shown in FIG. 6A. With a 100-KHz AC voltage $V_{FF}$ 602 imposed and with no compensation voltage added (i.e., with $V_{Comp}$ 604 equal to 0), the oscilloscope screen shot 606 in FIG. 6A shows the voltage $V_{FF}$ 602 and the current $I_{FF}$ 608 (for which a vertical scale of 1 V/A was selected) measured through the 47-ohm resistor 610.

Figure 6B:
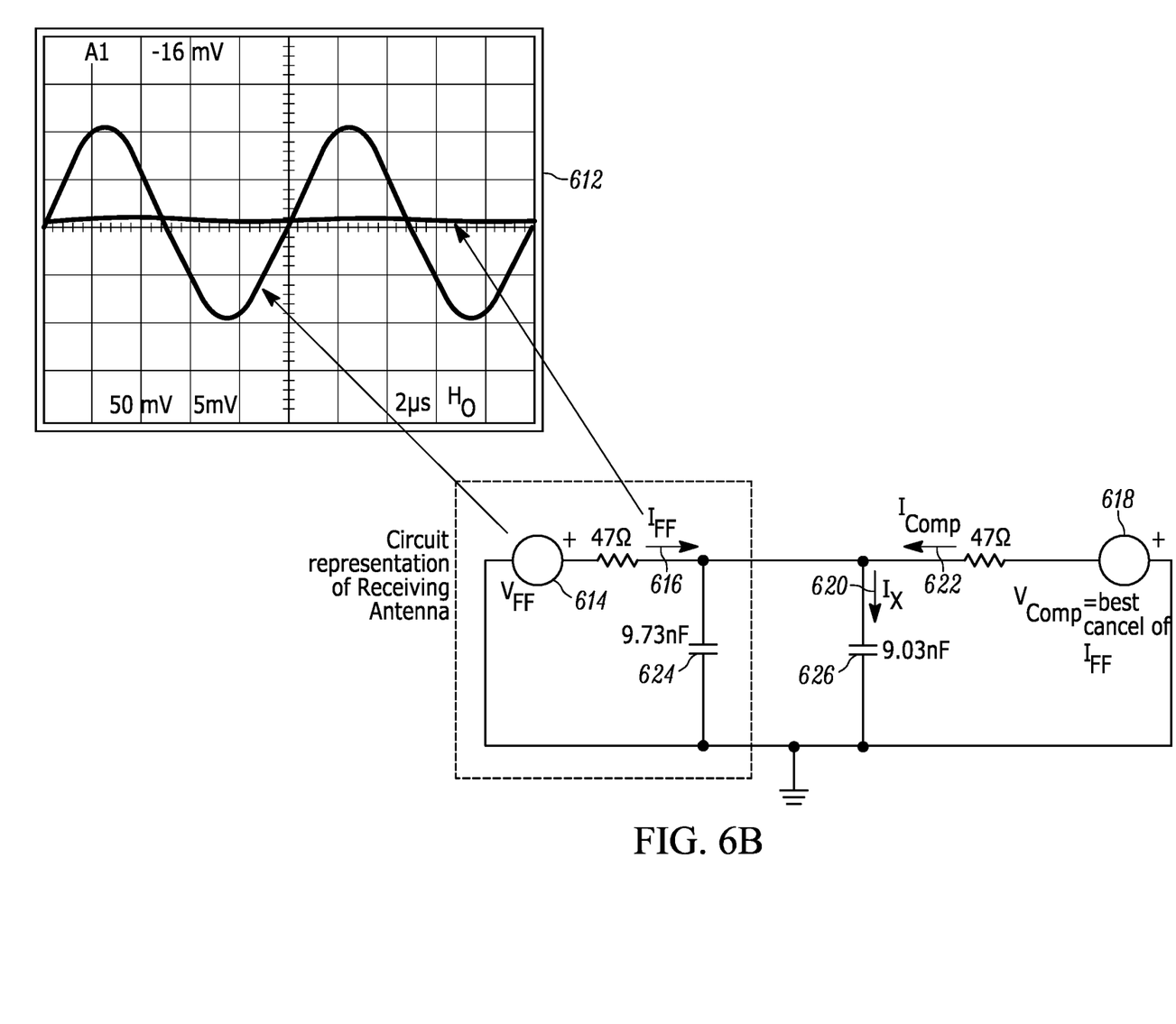
FIG. 6B illustrates an embodiment of a circuit of the present teaching as in FIG. 6A, but with $V_{Comp}$ set to a voltage that modifies $I_{FF}$ in such a way as to minimize its magnitude and therefore minimize the field in the far-field region.

FIG. 6B shows the oscilloscope display 612 of the measured $V_{FF}$ 614 and $I_{FF}$ 616 after $V_{Comp}$ 618 was adjusted to a level that minimized the magnitude of $I_{FF}$ 616. The measured ratio of $I_X$ 620 to $I_{Comp}$ 622 was 2.16, and the measured ratio of the sum of the reactances 624 and 626, i.e. $jX_A+jX_B$=9.73 nF+9.03 nF, to just the reactance 626, i.e. just $jX_B$=9.03 nF, was 2.08, showing that the ratio of those two measurable currents can be used as a way to experimentally confirm that $I_{FF}$ 616—which cannot be measured directly when an actual antenna replaces the components within the box in the left-hand part of the circuit diagram—is minimized, and also showing that this target ratio can be determined from a calculation using measured reactances in the antenna and circuit.

It is also possible to use voltages and/or currents in a sensing circuit connected to the antenna, rather than a separate electromagnetic field sensor, as the means of assessing the amplitude of the field in the reactive near-field or far-field region. Again referring to the circuit 500 of FIG. 5, illumination of the antenna 502 by a source in its far-field region induces the voltage $V_{FF}$, which in turn induces a field whose amplitudes in the reactive near-field region and in the far-field region are proportional to the currents through the resistive and reactive components of the antenna, respectively—i.e., $R_A$ and $jX_A$, respectively. The amplitudes of these two currents relate to measurable voltages and/or currents in the sensing circuit.

Figure 7:
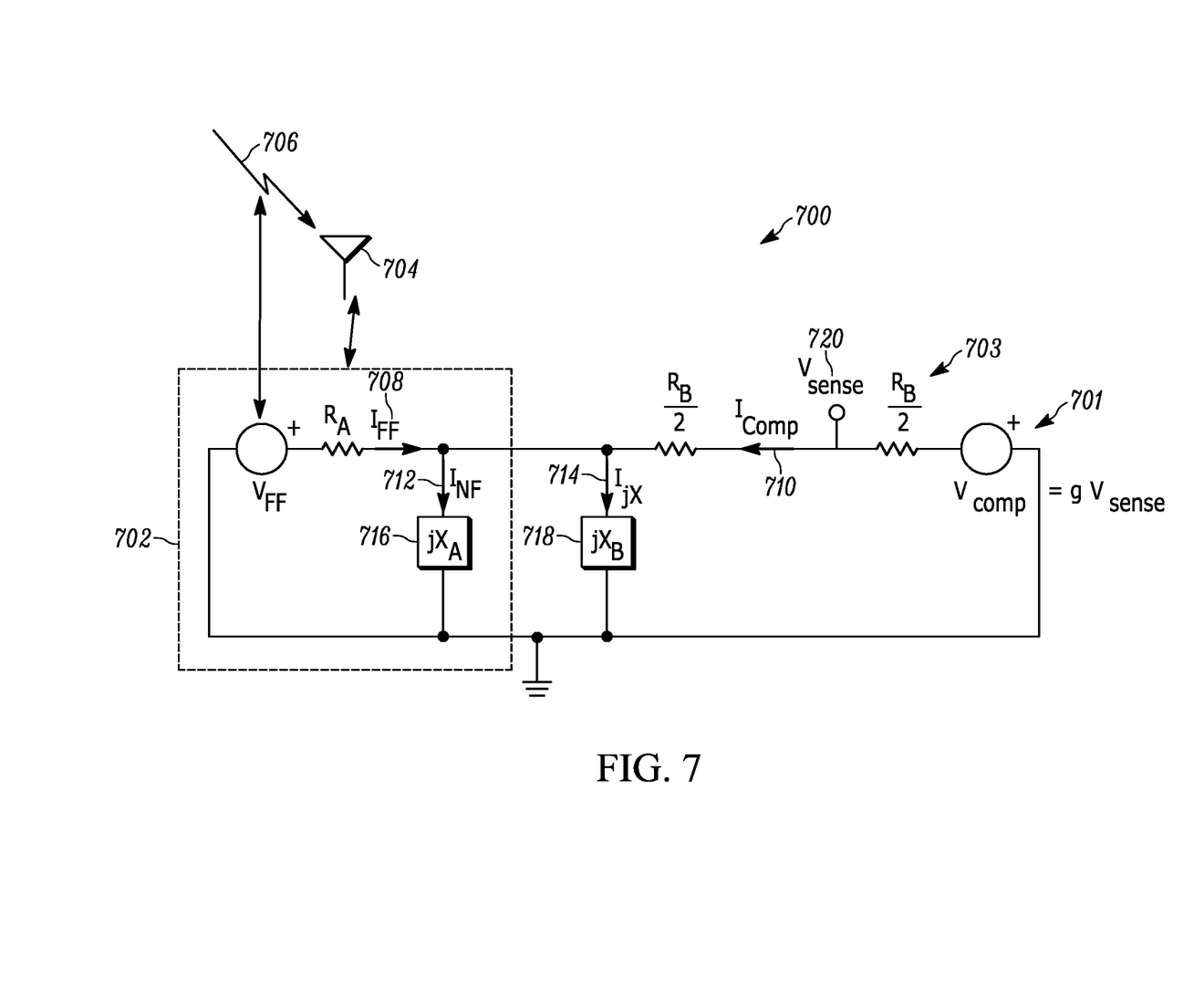
FIG. 7 illustrates an embodiment of a circuit according to the present teaching that is similar to the circuit described in connection with FIG. 5, but with the compensation voltage $V_{Comp}$ as a dependent voltage source with the voltage $V_{Comp}$ being proportional to a voltage sensed in the sensing circuit rather than proportional to a field sensed by a second antenna.

FIG. 7 illustrates an embodiment of a circuit 700 according the present teaching that is similar to the circuit 500 described in connection with FIG. 5, but with the compensation voltage source $V_{Comp}$ 701 as a dependent voltage source with the voltage $V_{Comp}$ being proportional to a voltage sensed in the sensing circuit 703 rather than proportional to a field sensed by a second antenna. In FIG. 7, $V_{Comp}$ is proportional, with a constant of proportionality of g, to a voltage $V_{sense}$ 720 that is measured at the midpoint of the resistance $R_B$—i.e., at a point where the resistance between this point and the antenna 704 is equal to $R_B/2$ and the resistance between this point and the dependent compensation voltage $V_{Comp}$ is also equal to $R_B/2$. There is also a current $I_{Comp}$ 710 that flows through the resistance $R_B$. The sensing circuit 703 also includes an impedance $jX_B$ 718 through which a current $I_{JX}$ 714 flows.

The antenna equivalent circuit 702 is identical to the antenna equivalent circuit 501 that was described in connection with FIG. 5. The antenna equivalent circuit 702 generates a far-field current $I_{FF}$ 708 and a near field current $I_{NF}$ 712 in response to the combination of illumination 706 from a distant transmitting antenna and the compensation voltage 701. The near-field current $I_{NF}$ 712 flows through reactance $jX_A$ 716. The circuit 700 can be configured so that radiation from the antenna 704 in either the reactive near-field region or in the far-field region is minimized.

Figure 8A:
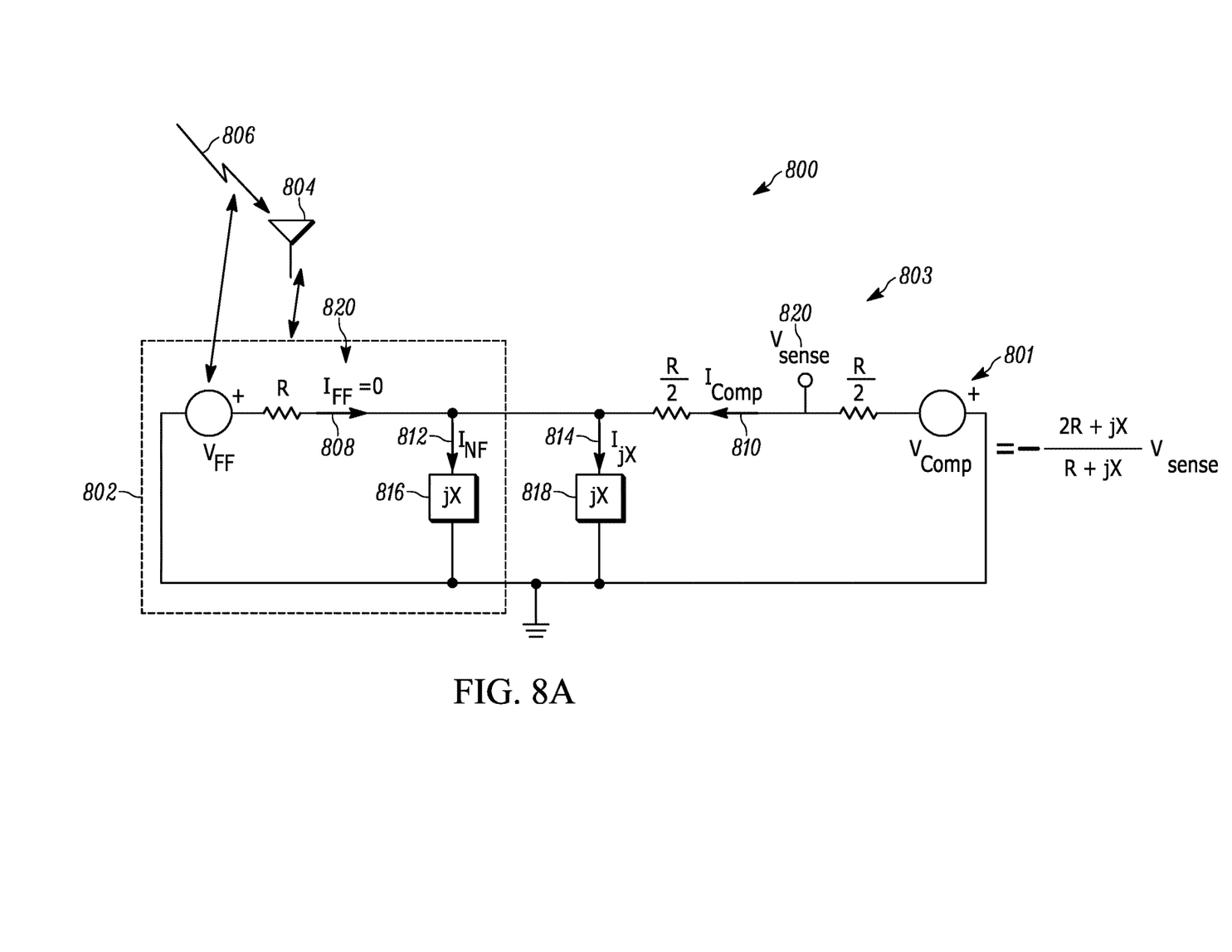
FIG. 8A illustrates an embodiment of a circuit according to the present teaching that is similar to the circuit described in connection with FIG. 5 that includes a dependent voltage source which generates a compensation voltage $V_{Comp}$ that is proportional to the voltage sensed at the midpoint of the real part of the impedance of the sensing circuit, where the constant of proportionality is specified so as to minimize the current through the resistive portion of the antenna's impedance, and therefore the amplitude of the radiation in the antenna's far-field region.

FIG. 8A illustrates an embodiment of a circuit 800 according to the present teaching that is similar to the circuit described in connection with FIG. 7 that includes a dependent voltage source 801 which generates a compensation voltage $V_{Comp}$ that is proportional to the voltage $V_{sense}$ 820 sensed at the midpoint of the real part of the impedance of the sensing circuit 801 with a compensating current $I_{Comp}$ 810, where the constant of proportionality is specified so as to minimize the current through the resistive portion of the antenna's impedance, and therefore the amplitude of the radiation in the antenna's far-field region. In the embodiment shown in FIG. 8A, the sensing circuit 803 is configured so that the constant of proportionality g of the voltage-dependent voltage source is equal to a value that causes the current $I_{FF}$ 808, which is proportional to the field re-radiated by the antenna in its far-field region due to the illumination that imposes the voltage $V_{FF}$, to be substantially equal to zero. To more easily illustrate the behavior of the sensing circuit but without loss of generality, in the embodiment shown in FIG. 8A the resistive component of the antenna impedance and the total resistive component of the sensing circuit impedance have both been set equal to R and the reactive components of both the antenna impedance 816 and the sensing circuit impedance 818 have been set equal to jX. For this sensing circuit 803, when g=−(2R+jX)/(R+jX) so that $$V_{Comp} = -\frac{2R+jX}{R+jX} V_{sense},$$

the currents $I_{FF}$ 808 and $I_{NF}$ 812 in the antenna 804 that are proportional to, respectively, the field in the far-field region and in the reactive near-field region due to the combined effects of the illuminating field proportional to $V_{FF}$ and the compensation voltage $V_{Comp}$ are, respectively, $$I_{FF} = \left[1 - \frac{g+2}{2(g+2)\frac{R}{jX}+3g+4}\right]\frac{V_{FF}}{R} = 0 \text{ if } g = -\frac{2R+jX}{R+jX},$$

and $$I_{NF} = \frac{g+2}{2(g+2)R+(3g+4)jX}V_{FF} = \frac{V_{FF}}{jX} = \frac{V_{sense}}{R+jX} \text{ if } g = -\frac{2R+jX}{R+jX},$$

which is equal to zero only when the illuminating field is absent so that $V_{FF}=0$ but is otherwise not equal to zero and is proportional to the non-zero voltage $V_{sense}$ 820.

Figure 8B:
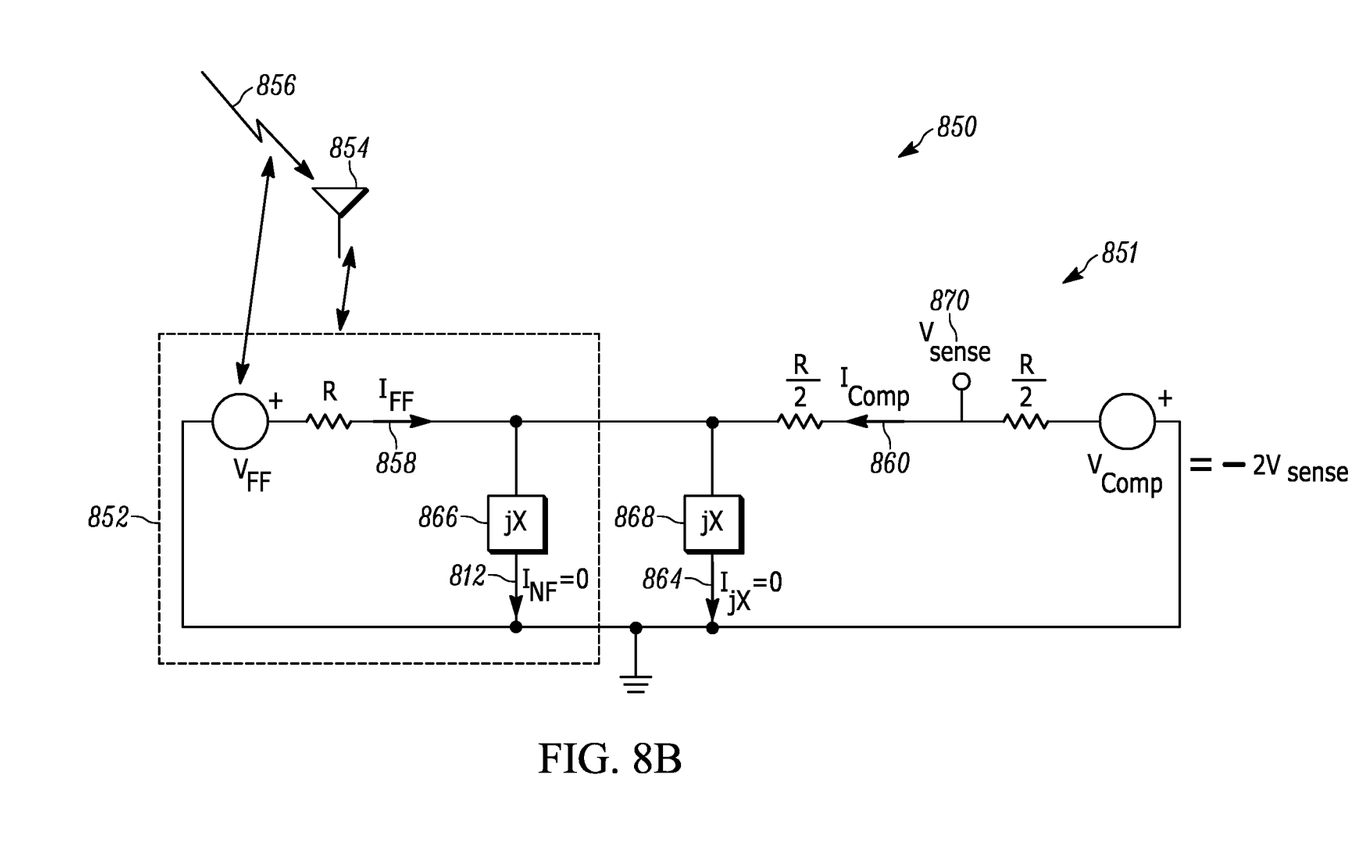
FIG. 8B illustrates an embodiment of a circuit according to the present teaching that is similar to the circuit described in connection with FIG. 5 that includes a dependent voltage source which generates a compensation voltage $V_{Comp}$ that is proportional to the voltage sensed at the midpoint of the real part of the impedance of the sensing circuit, where the constant of proportionality is specified so as to minimize the current through the reactive portion of the antenna's impedance, and therefore the amplitude of the radiation in the antenna's reactive near-field region.

FIG. 8B illustrates an embodiment of a circuit according to the present teaching that is similar to the circuit described in connection with FIG. 7 that includes a dependent voltage source which generates a compensation voltage $V_{Comp}$ that is proportional to the voltage sensed at the midpoint of the real part of the impedance of the sensing circuit, where the constant of proportionality is specified so as to minimize the current through the reactive portion of the antenna's impedance, and therefore the amplitude of the radiation in the antenna's reactive near-field region. In the embodiment shown in FIG. 8B, the sensing circuit 851 is configured so that the constant of proportionality g of the voltage-dependent voltage source is equal to a value that causes the current $I_{NF}$ 812 that is proportional to the field in the reactive near-field region to be substantially equal to zero. To more easily illustrate the behavior of the sensing circuit 851, but without loss of generality, in the embodiment shown in FIG. 8B, the resistive component of the antenna impedance and the total resistive component of the sensing circuit impedance have both been set equal to R and the reactive components of both the antenna impedance 866 and the sensing circuit impedance 868 have been set equal to jX. For this sensing circuit, when g=−2 so that $$V_{Comp} = -2V_{sense},$$

the currents $I_{NF}$ 812 and $I_{FF}$ 858 in the antenna equivalent circuit 852 that are proportional to the field in the reactive near-field region and the re-radiated field in the far-field region due to the combined effects of the illuminating field 856 proportional to $V_{FF}$ and the compensation voltage $V_{Comp}$ are, respectively, $$I_{NF} = \frac{g+2}{2(g+2)R+(3g+4)jX}V_{FF} = 0 \text{ if } g = -2,$$

and $$I_{FF} = \left[1 - \frac{g+2}{2(g+2)\frac{R}{jX}+3g+4}\right]\frac{V_{FF}}{R} = \frac{V_{FF}}{R} = -2\frac{V_{sense}}{R} \text{ if } g = -2,$$

which is equal to zero only when the illuminating field is absent so that $V_{FF}=0$ but is otherwise not equal to zero and is proportional to the non-zero voltage $V_{sense}$ 870.

EQUIVALENTS

While the Applicant's teaching is described in conjunction with various embodiments, it is not intended that the Applicant's teaching be limited to such embodiments. On the contrary, the Applicant's teaching encompasses various alternatives, modifications, and equivalents, as will be appreciated by those of skill in the art, which may be made therein without departing from the spirit and scope of the teaching.

What is claimed is:

1. An electromagnetic field manipulation apparatus comprising:
    a) an electromagnetic interface that generates an electromagnetic field in both a reactive near-field region and a radiating far-field, the electromagnetic interface comprising an impedance with a resistive and a reactive component;
    b) an electromagnetic sensor that senses an electromagnetic field in the radiating far-field region and that generates a signal at an output; and
    c) an electromagnetic modifier that reduces the electromagnetic field in the reactive near-field region in response to the signal generated at the output of the electromagnetic sensor.

2. The electromagnetic field manipulation apparatus of claim 1 wherein the electromagnetic interface comprises an antenna.

3. The electromagnetic field manipulation apparatus of claim 2 wherein the electromagnetic field in the reactive near-field region is reduced in order to reduce a mutual electromagnetic coupling between the antenna and nearby structures, thereby reducing interference and improving antenna performance.

4. The electromagnetic field manipulation apparatus of claim 1 wherein the electromagnetic sensor comprises a radiating far-field sensor that senses a reactive impedance and the electromagnetic modifier comprises a resistive component.

5. The electromagnetic field manipulation apparatus of claim 1 wherein the electromagnetic sensor comprises a resistor and the electromagnetic modifier comprises a varactor.

6. The electromagnetic field manipulation apparatus of claim 1 wherein the electromagnetic sensor comprises a radiating far-field sensor that senses a resistive impedance and the electromagnetic modifier comprises a reactive component.

7. The electromagnetic field manipulation apparatus of claim 1 wherein the electromagnetic sensor comprises a radiating far-field sensor that senses a resistive impedance and the electromagnetic modifier comprises a resistive component.

8. The electromagnetic field manipulation apparatus of claim 1 wherein the electromagnetic sensor comprises an electro-optic modulator comprising un-terminated electrodes and the electromagnetic modifier comprises a voltage source.

9. The electromagnetic field manipulation apparatus of claim 1 wherein the electromagnetic modifier operates substantially independently on either the electromagnetic field in the reactive near-field region or the electromagnetic field in the far-field region.

10. The electromagnetic field manipulation apparatus of claim 1 wherein the electromagnetic sensor comprises an electromagnetic near-field sensor that senses the reactive impedance and the electromagnetic modifier comprises a reactive component.

11. The electromagnetic field manipulation apparatus of claim 1 wherein the electromagnetic sensor senses a portion of the electromagnetic field in the far-field region and the electromagnetic modifier preferentially modifies the electromagnetic field in the reactive near-field region at the interface in response to the sensed portion of the electromagnetic field in the far-field region such that a ratio of the field in the reactive near-field region to the field in the far-field region is minimized.

12. The electromagnetic field manipulation apparatus of claim 1 wherein a voltage across the electromagnetic sensor voltage is 90° out-of-phase with the current through the electromagnetic sensor.

13. An electromagnetic field manipulation apparatus comprising:
   a) an electromagnetic interface that generates an electromagnetic field in both a reactive near-field region and a radiating far-field, the electromagnetic interface comprising an impedance with a resistive and a reactive component;
   b) an electromagnetic sensor that senses an electromagnetic field in the reactive near-field region and that generates a signal at an output; and
   c) an electromagnetic modifier that reduces the electromagnetic field in the radiating far-field region in response to the signal generated at the output of the electromagnetic sensor.

14. The electromagnetic field manipulation apparatus of claim 13 wherein the electromagnetic interface comprises an antenna.

15. The electromagnetic field manipulation apparatus of claim 14 wherein the electromagnetic field in the radiating far-field region is reduced in order to reduce a mutual electromagnetic coupling between the antenna and nearby structures, thereby reducing interference and improving antenna performance.

16. The electromagnetic field manipulation apparatus of claim 13 wherein the electromagnetic sensor comprises a near-field sensor that senses a reactive impedance and the electromagnetic modifier comprises a resistive component.

17. The electromagnetic field manipulation apparatus of claim 13 wherein the electromagnetic sensor comprises a resistor and the electromagnetic modifier comprises a varactor.

18. The electromagnetic field manipulation apparatus of claim 13 wherein the electromagnetic sensor comprises a near-field sensor that senses a resistive impedance and the electromagnetic modifier comprises a reactive component.

19. The electromagnetic field manipulation apparatus of claim 13 wherein the electromagnetic sensor comprises a near-field sensor that senses a resistive impedance and the electromagnetic modifier comprises a resistive component.

20. The electromagnetic field manipulation apparatus of claim 13 wherein the electromagnetic sensor comprises an electro-optic modulator comprising un-terminated electrodes and the electromagnetic modifier comprises a voltage source.

21. An electromagnetic field manipulation apparatus comprising:
   a) an electromagnetic interface that generates an electromagnetic field in both a reactive near-field region and a radiating far-field, the electromagnetic interface comprising an impedance with a resistive and a reactive component;
   b) a sensing circuit that generates voltage and/or current having at least one of real and imaginary components that are proportional to an electromagnetic field in at least one of the reactive near-field region and the radiating far-field region, and that generates a signal at an output; and
   c) an electromagnetic modifier that reduces the electromagnetic field in at least one of the reactive near-field region and the radiating far-field region in response to the signal generated at the output of the sensing circuit.

22. The electromagnetic field manipulation apparatus of claim 21 wherein the electromagnetic interface comprises an antenna.

23. The electromagnetic field manipulation apparatus of claim 21 wherein the electromagnetic modifier reduces the electromagnetic field in the reactive near-field region in order to reduce a mutual electromagnetic coupling between the electromagnetic interface and nearby structures, thereby reducing interference and improving electromagnetic interface performance.

24. The electromagnetic field manipulation apparatus of claim 21 wherein the electromagnetic modifier operates substantially independently on either the electromagnetic field in the reactive near-field region or the electromagnetic field in the far-field region.

25. The electromagnetic field manipulation apparatus of claim 1 wherein the electromagnetic modifier produces a voltage at a port of the electromagnetic interface nominally equal to a voltage corresponding to the generated electromagnetic field in the reactive near field region.

26. The electromagnetic field manipulation apparatus of claim 13 wherein the electromagnetic modifier produces a current corresponding to the electromagnetic field in the radiating far field that is nominally equal to zero.

27. The electromagnetic field manipulation apparatus of claim 21 wherein the electromagnetic modifier produces a voltage at a port of the electromagnetic interface nominally equal to a voltage corresponding to the generated electromagnetic field in the reactive near field region.

28. The electromagnetic field manipulation apparatus of claim 21 wherein the electromagnetic modifier produces a current corresponding to the electromagnetic field in the radiating far field that is nominally equal to zero.

* * * * *